United States Patent
Fang et al.

(10) Patent No.: US 9,324,865 B2
(45) Date of Patent: Apr. 26, 2016

(54) METHOD OF FORMING A SEMICONDUCTOR DEVICE

(71) Applicant: Taiwan Semiconductor Manufacturing Company, Ltd., Hsin-Chu (TW)

(72) Inventors: Ziwei Fang, Baoshan Township (TW); Tsan-Chun Wang, Hsin-Chu (TW); De-Wei Yu, Ping-tung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/514,284

(22) Filed: Oct. 14, 2014

(65) Prior Publication Data

US 2015/0028355 A1    Jan. 29, 2015

Related U.S. Application Data

(63) Continuation of application No. 13/471,986, filed on May 15, 2012, now Pat. No. 8,877,599.

(51) Int. Cl.

| | |
|---|---|
| *H01L 29/00* | (2006.01) |
| *H01L 29/78* | (2006.01) |
| *H01L 21/265* | (2006.01) |
| *H01L 21/324* | (2006.01) |
| *H01L 29/66* | (2006.01) |
| *H01L 21/8238* | (2006.01) |
| *H01L 29/16* | (2006.01) |
| *H01L 29/165* | (2006.01) |

(52) U.S. Cl.
CPC ...... *H01L 29/7848* (2013.01); *H01L 21/26506* (2013.01); *H01L 21/324* (2013.01); *H01L 21/823807* (2013.01); *H01L 21/823814* (2013.01); *H01L 21/823878* (2013.01); *H01L 29/165* (2013.01); *H01L 29/1608* (2013.01); *H01L 29/66636* (2013.01); *H01L 29/7847* (2013.01); *H01L 21/26586* (2013.01); *H01L 21/26593* (2013.01)

(58) Field of Classification Search
CPC ............... H01L 21/26505; H01L 21/26586; H01L 21/26593; H01L 21/24; H01L 21/823807; H01L 21/823814; H01L 21/823878; H01L 29/7848; H01L 29/66636; H01L 29/7847; H01L 29/1608; H01L 29/165
See application file for complete search history.

(56) References Cited

U.S. PATENT DOCUMENTS

| | | | |
|---|---|---|---|
| 5,612,253 | A | 3/1997 | Farahani et al. |
| 6,008,111 | A | 12/1999 | Fushida et al. |
| 6,297,115 | B1 | 10/2001 | Yu |
| 8,629,046 | B2 | 1/2014 | Tsai et al. |
| 2005/0224867 | A1 | 10/2005 | Huang et al. |

(Continued)

*Primary Examiner* — Victor A Mandala
*Assistant Examiner* — Quovaunda V Jefferson
(74) *Attorney, Agent, or Firm* — Slater & Matsil, L.L.P.

(57) ABSTRACT

A semiconductor device having dislocations and a method of fabricating the semiconductor device is disclosed. The exemplary semiconductor device and method for fabricating the semiconductor device enhance carrier mobility. The method includes providing a substrate having an isolation feature therein and two gate stacks overlying the substrate, wherein one of the gate stacks is atop the isolation feature. The method further includes performing a pre-amorphous implantation process on the substrate. The method further includes forming a stress film over the substrate. The method also includes performing an annealing process on the substrate and the stress film.

20 Claims, 6 Drawing Sheets

(56) References Cited

U.S. PATENT DOCUMENTS

| | | |
|---|---|---|
| 2007/0254461 A1 | 11/2007 | Wei et al. |
| 2008/0003789 A1 | 1/2008 | Chen et al. |
| 2008/0020591 A1 | 1/2008 | Balseanu et al. |
| 2008/0102590 A1 | 5/2008 | Gehring et al. |
| 2008/0191244 A1* | 8/2008 | Kim ................ H01L 21/823807 257/190 |
| 2009/0001371 A1 | 1/2009 | Mowry et al. |
| 2009/0079008 A1 | 3/2009 | Nandakumar et al. |
| 2010/0038685 A1* | 2/2010 | Weber ............... H01L 21/26506 257/288 |
| 2010/0081245 A1 | 4/2010 | Yang et al. |
| 2010/0148270 A1* | 6/2010 | Golonzka ....... H01L 21/823807 257/369 |
| 2011/0212590 A1 | 9/2011 | Wu et al. |
| 2013/0178029 A1* | 7/2013 | Wang et al. .................. 438/285 |

* cited by examiner

METHOD OF FORMING A SEMICONDUCTOR DEVICE

CROSS-REFERENCE TO RELATED APPLICATION

This application is a continuation application of U.S. patent application Ser. No. 13/471,986, filed on May 15, 2012 and entitled "Method of Forming a Semiconductor Device," which application is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
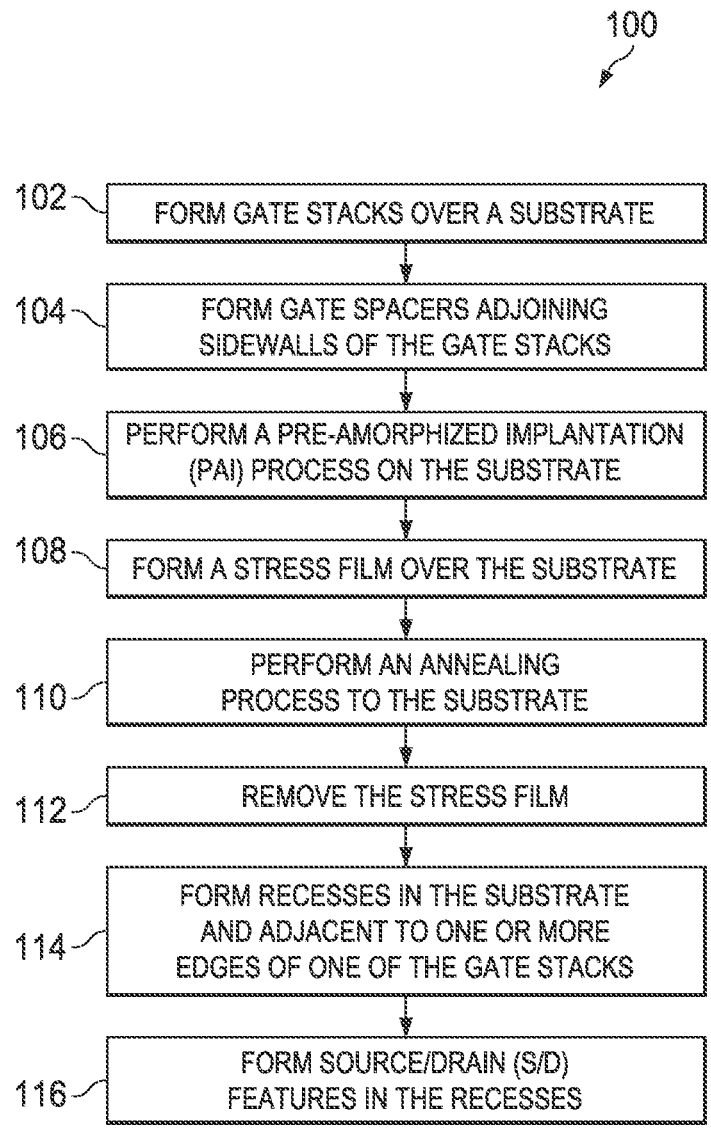
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present invention. It is understood, however, that the invention should not be limited to a particular type of device, except as specifically claimed.

With reference to FIGS. 1 and 2-9, a method 100 and a semiconductor device 200 are collectively described below. The semiconductor device 200 illustrates an integrated circuit, or portion thereof, that can comprise active devices such as metal-oxide-semiconductor field effect transistors (MOSFETs), complementary metal-oxide-semiconductor (CMOS) transistors, high voltage transistors, and/or high frequency transistors, other suitable components, and/or combinations thereof. The semiconductor device 200 may include passive components, such as resistors, capacitors, inductors, and/or fuses. It is understood that the semiconductor device 200 may be formed by CMOS technology processing, and thus some processes are not described in detail herein. Additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 for fabricating a semiconductor device is described according to various aspects of the present disclosure. The method 100 begins with step 102 in which gate stacks over a substrate is provided. The method 100 continues with step 104 in which gate spacers are formed adjoining sidewalls of the gate stacks. The method 100 continues at step 106 in which a pre-amorphous implantation (PAI) process is performed on the substrate. The method 100 continues at step 108 in which a stress film is deposited over the substrate. The method 100 continues at step 110 in which an annealing process is performed on the substrate. The method 100 continues at step 112 in which the stress film is removed. The method 100 continues at step 114 in which recesses are formed in the substrate and adjacent to one or more edges of one of the gate stacks. The method 100 continues at step 116 in which source/drain (S/D) features are formed in the recesses. The discussion that follows illustrates various embodiments of a semiconductor device 200 that can be fabricated according to the method 100 of FIG. 1.

Figure 2:
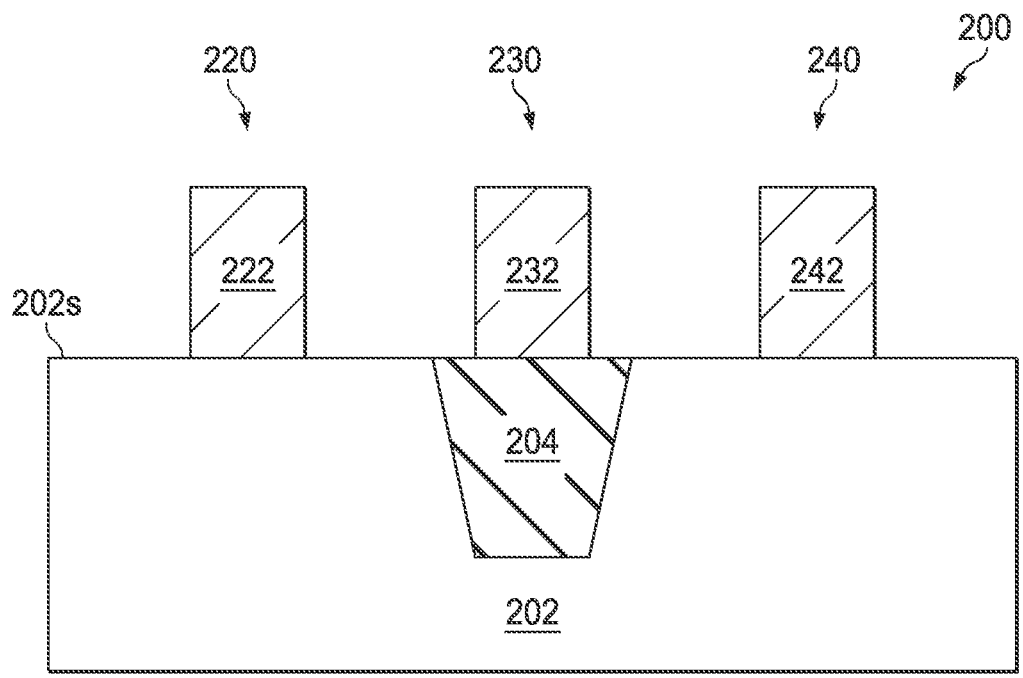
FIGS. 2 to 9 illustrate diagrammatic cross-sectional side views of some embodiments of a semiconductor device at various stages of fabrication according to the method of FIG. 1.

FIGS. 2 to 9 illustrate diagrammatic cross-sectional side views of one embodiment of a semiconductor device 200 at various stages of fabrication according to the method 100 of FIG. 1. Referring to FIGS. 1 and 2, the method 100 begins at step 102 wherein gate structures 220, 230, and 240 are formed over a substrate 202. The substrate 202 has a surface 202s. In the present embodiment, the substrate 202 is a semiconductor substrate including silicon. Alternatively, the substrate 202 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 202 is an alloy semiconductor, the alloy semiconductor substrate could have a gradient feature, for example a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative, the semiconductor substrate could be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

Still referring to FIG. 2, an insulator feature 204 is formed in the substrate 202 to define and isolate various active regions of the substrate 202. In some embodiment, the insulator feature 204 is formed utilizing isolation technology, such as shallow trench isolation (STI) or local oxidation of silicon (LOCOS), to define and electrically isolate the various regions. In some embodiment, the insulator feature 204 includes silicon oxide, silicon nitride, silicon oxynitride, other suitable materials, or combinations thereof.

Still referring to FIG. 2, the gate structure 220 and the gate structure 240 are disposed over channel regions for a NMOS device and a PMOS device, respectively. In the present embodiment, the gate structure 230 is a dummy structure and disposed over the insulator feature 204. The gate structures 220, 230, and 240 include various gate material layers. In the present embodiment, the gate structures 220, 230, and 240 include gate stacks 222, 232, and 242 (also referred to as gate electrodes), respectively. The gate stacks 222, 232, and 242 are formed over the substrate 202 to a suitable thickness. In an example, the gate stacks 222, 232, and/or 242 comprise a polycrystalline silicon (or polysilicon) layer. The polysilicon layer may be doped for proper conductivity. Alternatively, the polysilicon is not doped, for example, if a dummy gate is to be formed and later replaced by a gate replacement process. In another example, the gate stacks 222, 232, and/or 242 comprise a conductive layer having a proper work function, therefore, the gate stacks 222, 232, and/or 242 can also be referred to as a work function layer. The work function layer includes a suitable material, such that the layer can be tuned to have a proper work function for enhanced performance of the device. For example, if a P-type work function metal (P-metal) for a PMOS device is desired, TiN or TaN may be used. On the other hand, if an N-type work function metal (N-metal) for an NMOS device is desired, Ta, TiAl, TiAlN, or TaCN, may be used. The work function layer could include doped conducting oxide materials. The gate stacks 222, 232, and/or 242 could include other conductive materials, such as aluminum, copper, tungsten, metal alloys, metal silicide, other suitable materials, and/or combinations thereof. The gate stacks 222, 232, and/or 242 could include a single layer or multiple layers. For example, where the gate stacks 222, 232, and/or 242 include a work function layer; another conductive layer can be formed over the work function layer. The gate stacks 222, 232, and/or 242 are formed by chemical vapor deposition (CVD), physical vapor deposition (PVD), atomic layer deposition (ALD), high density plasma CVD (HDPCVD), plating, other suitable methods, and/or combinations thereof.

Figure 3:
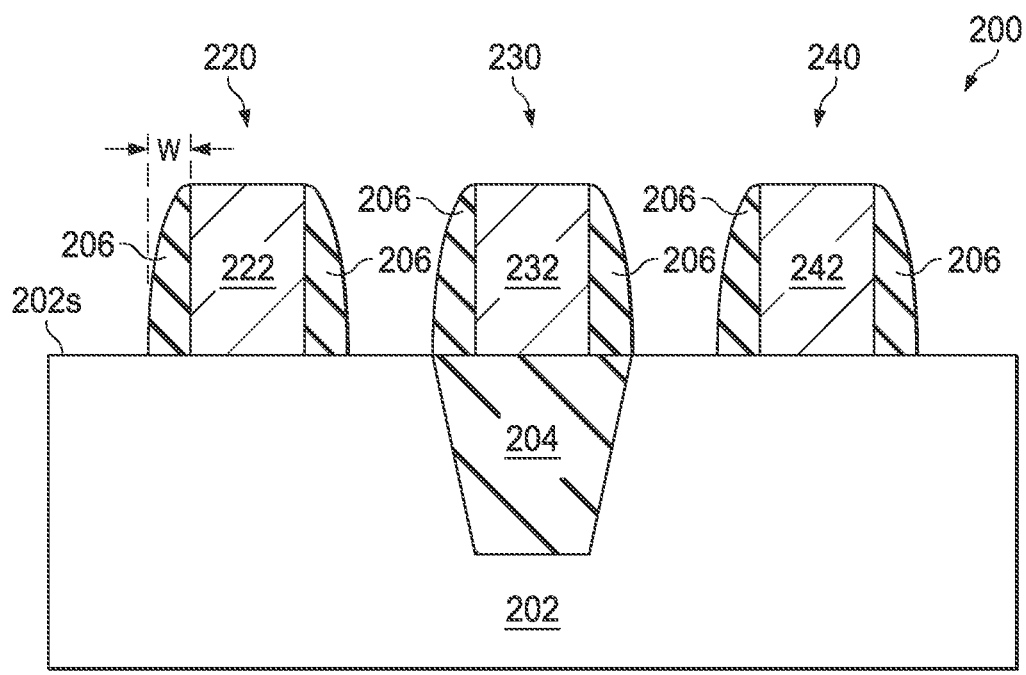

Referring to FIGS. 1 and 3, the method 100 proceeds to step 104 wherein gate spacers 206 are formed adjoining sidewalls of the gate stacks 222, 232, and 242. In some embodiments, the gate spacer material comprises SiCN, silicon oxide, silicon nitride, silicon oxy-nitride, other suitable material, or combinations thereof. In some embodiments, the gate spacers 206 have a width W ranging between about 5 nanometers and about 15 nanometers. In some embodiments, a blanket layer of gate spacer material (not shown) is formed over the substrate 202 and the gate stacks 222, 232, and 242 by a depositing process including CVD, PVD, ALD, or other suitable techniques. Then, an anisotropic etching process is applied to remove portions of the gate spacer material above the substrate 202, and the gate stacks 222, 232, and 242 while leaving portions of the gate spacer material adjoining sidewalls of the gate stacks 222, 232, and 242 to form the gate spacers 206.

Still referring to FIG. 3, the substrate 202 may further include a source region and a drain region on both sides of each of the gate structures 220 and 240, the channel regions being the regions between the source regions and the drain regions. In the present embodiment, source and drain features (also referred to as strained structures) (not shown) are formed in the source and drain regions on both sides of the gate structure 240. The source and drain features may alternatively be referred to as raised source and drain regions formed on the substrate 202. In some embodiments, a semiconductor material is formed in recesses of substrate 202 using an epitaxial (epi) process for forming the source and drain features. In some embodiments, the semiconductor material comprises a material different from the substrate 202 to provide a stress (strain) on the channel region of the PMOS device to enable carrier mobility of the device and enhance device performance. In some embodiments, the source and drain features of the gate structure 240 comprise silicon germanium (SiGe) formed by an epi process.

Figure 4:
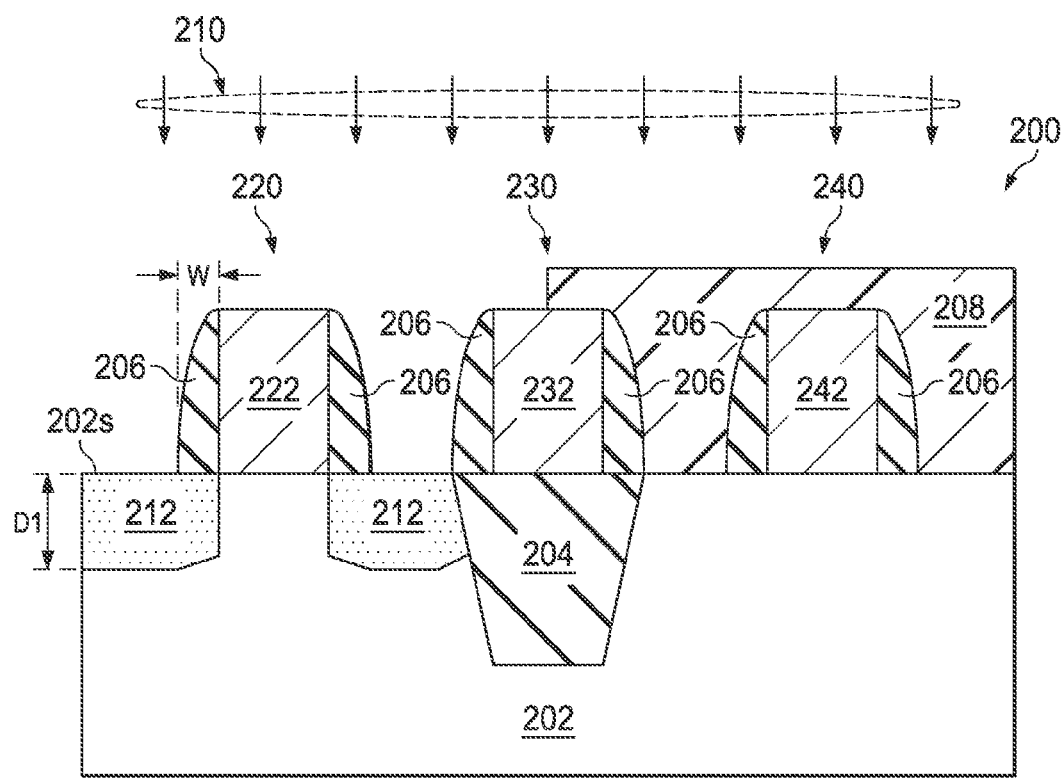

Referring to FIGS. 1 and 4, the method 100 proceeds to step 106 wherein a pre-amorphous implantation (PAI) process 210 is performed on the substrate 202. The PAI process 210 implants the substrate 202, damaging the lattice structure of the substrate 202, and forming amorphized regions 212. In the present embodiment, the amorphized regions 212 are formed in source and drain regions on both sides of the gate structure 220. In other embodiments, an amorphized region may be formed only one side only of the gate structure 220. The amorphized regions 212 have a depth, D1. The depth, D1, is formed according to design specifications. The depth, D1, in some embodiments, ranges between from about 10 nanometers to about 150 nanometers. In the present embodiment, the depth, D1, is less than about 100 nanometers. The depth, D1, can be controlled by the PAI process 210, such as by controlling implant energy, implant species, and/or implant dosage. In one embodiment, the PAI process 210 implants the substrate 202 with silicon (Si) and/or germanium (Ge). In an alternative embodiment, the PAI process 210 could utilize other implant species, such as Ar, Xe, $BF_2$, As, In, other suitable implant species, or combinations thereof. In the present embodiment, the PAI process 210 implants Si and/or Ge at an implant energy ranging from about 10 KeV to about 50 KeV, and an implant dosage ranging from about $1 \times 10^{13}$ atoms/cm$^2$ to about $2 \times 10^{15}$ atoms/cm$^2$, depending on the implantation temperature. In one embodiment, the PAI process 210 is performed at room temperature (e.g. 25° C.). In an alternative embodiment, the PAI process 210 is performed at a low temperature (e.g., −60° C. to −100° C.) by adapting a Cryo (low temperature) function in the ion implanter to enhance the efficiency of amorphization. In some embodiments, the PAI process 210 is performed with a tilt angle ranging from about 0 degrees to about 20 degrees.

Alternatively, the PAI process 210 can be a multiple-step implantation process, including at least a first step and a second step of the implantation process. The first and the second steps of the implantation process are performed using a first and a second implant energy, a first and a second implant dosage, and a first and a second implant tilt angles. In one embodiment, the first and the second implant energies independently range from about 10 KeV to about 50 KeV. In another embodiment, the first implant energy is greater than the second implant energy. In one embodiment, the first and the second implant dosages independently range from about $1 \times 10^{13}$ atoms/cm$^2$ to about $2 \times 10^{15}$ atoms/cm$^2$. In another embodiment, the first implant dosage is greater than the second implant dosage. In some embodiments, a combined dosage of the first and the second implant dosages range from about $1 \times 10^{13}$ atoms/cm$^2$ to about $2 \times 10^{15}$ atoms/cm$^2$, and a ratio between the first and the second implant dosages ranges from about 1:1 to about 7:3. In one embodiment, the first and the second tilt angles independently range from about 0 degree to about 20 degrees. In another embodiment, the first implant tilt angle is greater than the second implant tilt angle.

In some embodiments, a patterned mask layer 208 is utilized to define where the amorphized regions 212 are formed and protect other regions of the semiconductor device 200 from implantation damage. For example, the patterned mask layer 208 exposes the source/drain regions on both sides of the gate structure 220, such that the source/drain regions on both sides of the gate structure 220 are exposed to the PAI process 210 (forming the amorphized regions 212) while the source/drain regions on both sides of the gate structure 240 (and other portions of the semiconductor device 200) are protected from the PAI process 210. In the present embodiment, the patterned mask layer 208 is a photoresist layer. Alternatively, the patterned mask layer 208 is a hard mask layer, such as a SiN or SiON layer. The patterned mask layer 208 may be part of the current manufacturing process (e.g., LDD or source/drain formation); thereby minimizing cost as no additional photoresist layer or hard mask is required for the PAI process 210.

Figure 5:
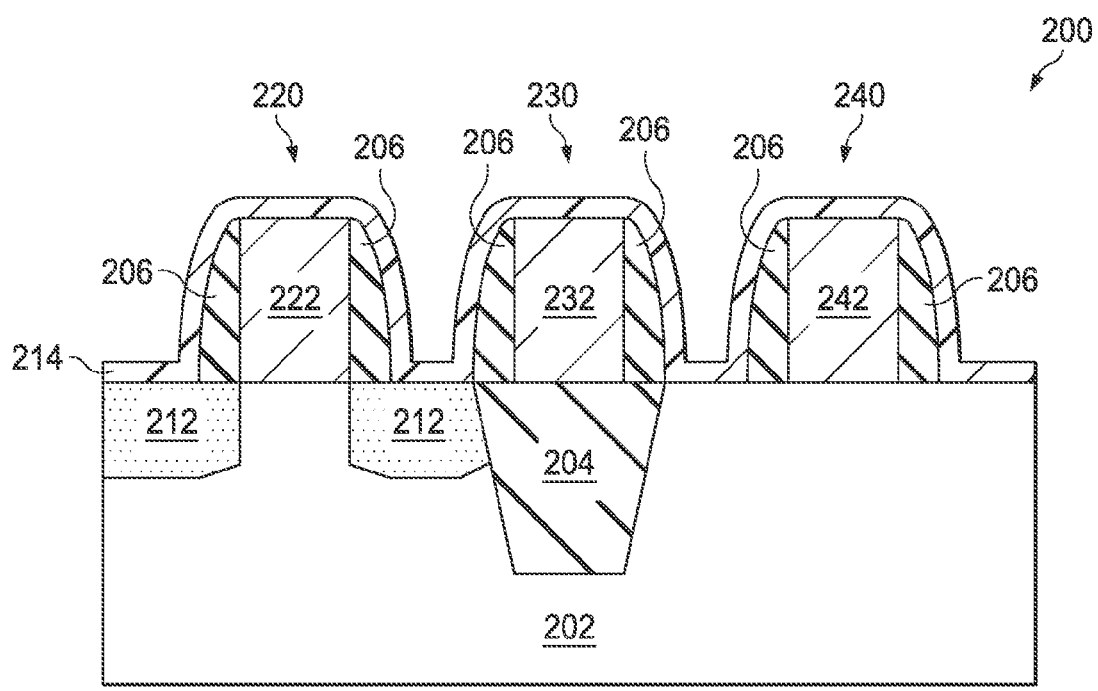

Referring to FIGS. 1 and 5, the method 100 proceeds to step 108 wherein a stress film 214 is deposited over the substrate 202 and the gate stacks 222, 232, and 242. In some embodiments, the stress film 214 is formed using a process, comprising CVD, PVD, ALD, HDPCVD, plating, other suitable methods, and/or combinations thereof. In some embodiments, the stress film 214 includes a dielectric material, such as silicon nitride, silicon oxide, silicon oxynitride, other suitable materials, and/or combinations thereof. In some embodiments, the stress film 214 is formed under a process temperature less than about 500° C., to prevent the amorphized regions 212 from re-crystallizing during this stage. In some embodiments, the stress film 214 is used to provide tensile stress in a subsequent annealing process 216 to recrystallize the amorphized regions 212.

Figure 6:
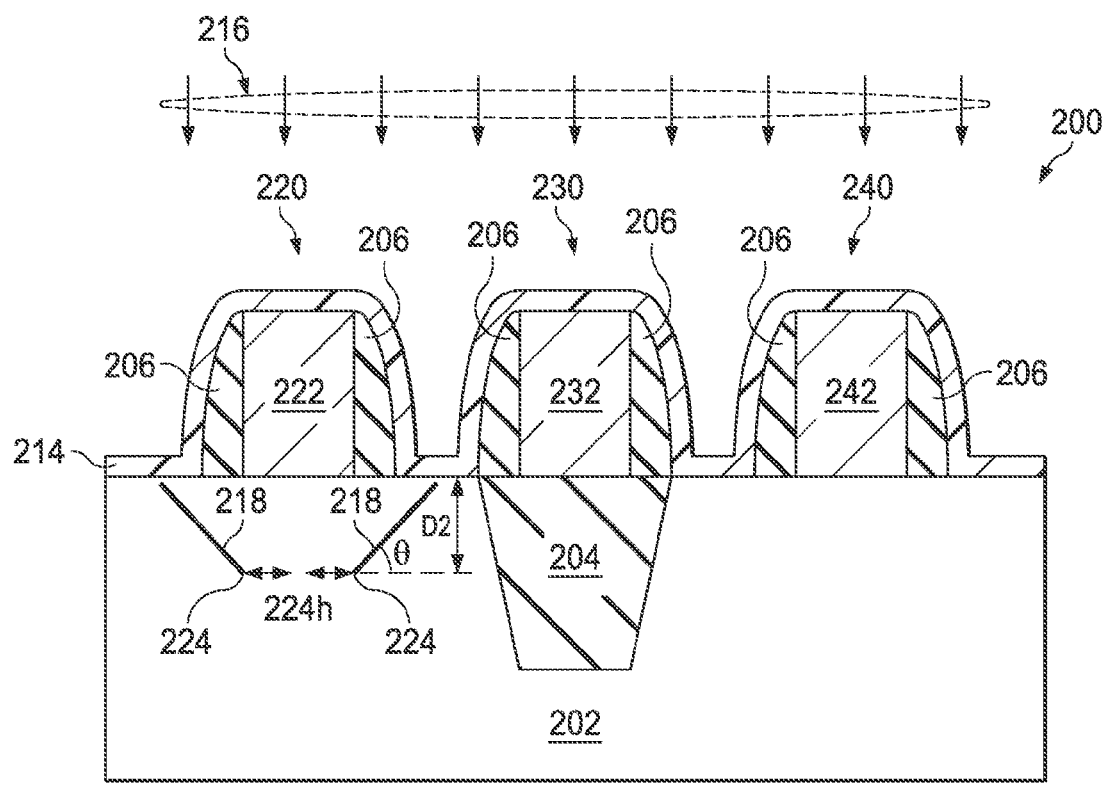

Referring to FIGS. 1 and 6, the method 100 proceeds to step 110 wherein an annealing process 216 is applied to the substrate 202. In some embodiments, the annealing process 216 is a furnace annealing process, rapid thermal annealing (RTA) process, spike RTA, millisecond thermal annealing (MSA) process (e.g., flash annealing process), or laser thermal annealing process. In some embodiments, dislocations 218 are formed in the substrate 202, with the amorphized regions 212 being re-crystallized by the annealing process 216. In some embodiments, the dislocations 218 are formed in a <111> direction. In some embodiments, the <111> direction has an angle θ, measured with respect to an axis parallel to the surface 202s of the substrate 202, ranging from about 45 to about 65 degrees. In the present embodiment, the dislocations 218 have <111> direction with the angle θ of about 55 degrees.

The dislocations 218 are formed starting at pinchoff points 224. The pinchoff points 224 have a depth D2 measured from the surface 202s of the substrate 202. In some embodiments, the depth D2 of the pinchoff points 224 ranges from about 10 nanometers to about 150 nanometers. In the present embodiment, the depth D2 of the pinchoff points 224 ranges from about 10 nanometers to about 30 nanometers. The pinchoff points 224 have a horizontal buffer (proximity) 224h measured from an adjacent gate edge of the gate stack 222. The horizontal buffer 224h and the depth D2 are formed according to design specifications and are a function of the annealing process 216. In some embodiments, the horizontal buffer 224h of the pinchoff points 224 ranges from about −5 nanometers to about 15 nanometers ("−" represents the pinchoff points 224 are under the gate stack 222). The pinchoff points 224 may be formed such that they are not disposed within the channel region.

Figure 10:
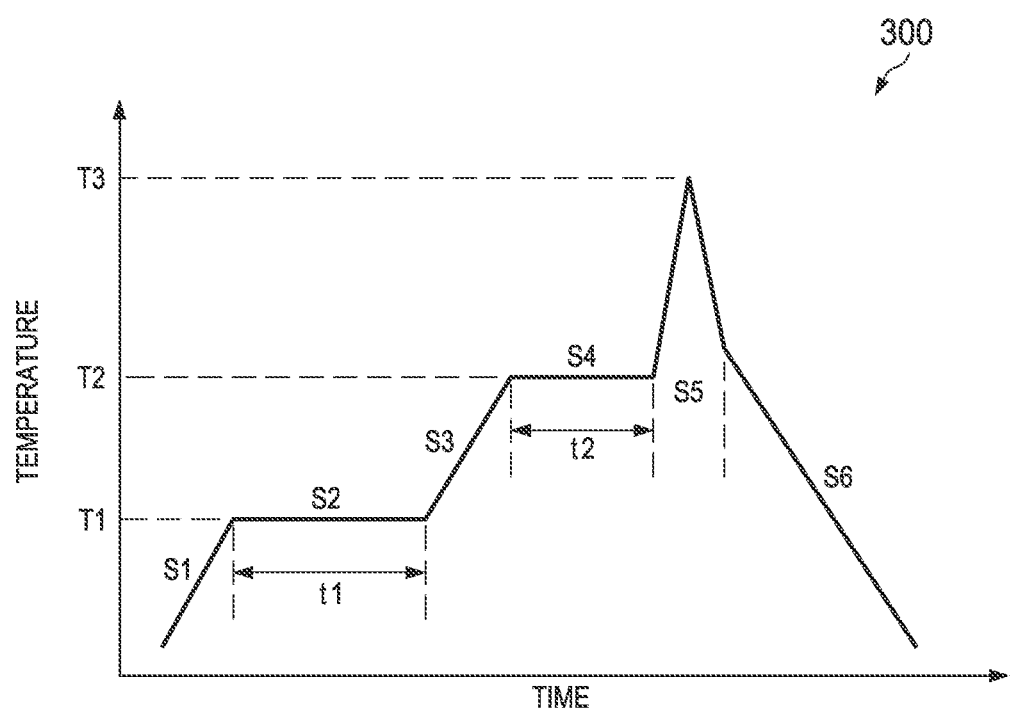
FIG. 10 is a temperature profile illustrating a method of annealing a semiconductor device according to various aspects of the present disclosure.

In some embodiments, the annealing process 216 is performed with a temperature profile 300 as illustrating in FIG. 10. In some embodiments, six stages, S1-S6, are included in the temperature profile 300 for performing the annealing process 216. The temperature profile 300 begins with the stage S1 identified as a first ramp up step wherein a temperature is increased from about room temperature (e.g., 25° C.) to a first target temperature T1. In some embodiments, the first target temperature T1 ranges between about 400° C. and about 600° C. The temperature profile 300 continues with the stage S2 identified as a first period t1 of constant temperature (the first target temperature T1). In some embodiments, the first period t1 ranges between about 10 seconds and about 60 seconds. In some embodiments, the stage S2 functions as modifying the shape of the amorphized regions 212, such as making interface between the amorphized regions 212 and the substrate 202 smoother and/or making the corners of the amorphized regions 212 less round. The temperature profile 300 continues with the stage S3 identified as a second ramp up step wherein the first target temperature T1 is further increased to a second target temperature T2. In some embodiments, the second target temperature T2 ranges between about 600° C. and about 700° C. Then, the temperature profile 300 continues with the stage S4 identified as a second period t2 of constant temperature (the second target temperature T2). In some embodiments, the second period t2 ranges between about 10 seconds and about 60 seconds. In some embodiments, the stage S3 functions as re-crystallizing the amorphized regions 212 to form the dislocations 218. As mentioned above, smoother interface between the amorphized regions 212 and the substrate 202 and/or less round corners of the amorphized regions 212 are provided in the lower target temperature T1, therefore, the resulting locations of dislocations 218 can be precisely controlled by the subsequent higher target temperature T2. Then, the temperature profile 300 continues with the stage S5 to complete the formation of the dislocations 218 and/or activate the existing dopants in the substrate 202. In some embodiments, a peak temperature T3 within the stage S5 is greater than about 950° C. In some embodiments, a period of the stage S5 ranges between about 1 second and about 10 seconds. A ramp down stage S6 is thereafter provided to drop the temperature to about the room temperature to complete the annealing process 216.

In some embodiments, six stages, S1-S6, are all performed by spike RTA. In alternative embodiments, the previous four stages, S1-S4, are performed by spike RTA and the last two stages, S5-S6, are performed by flash annealing process or laser thermal annealing process.

Figure 7:
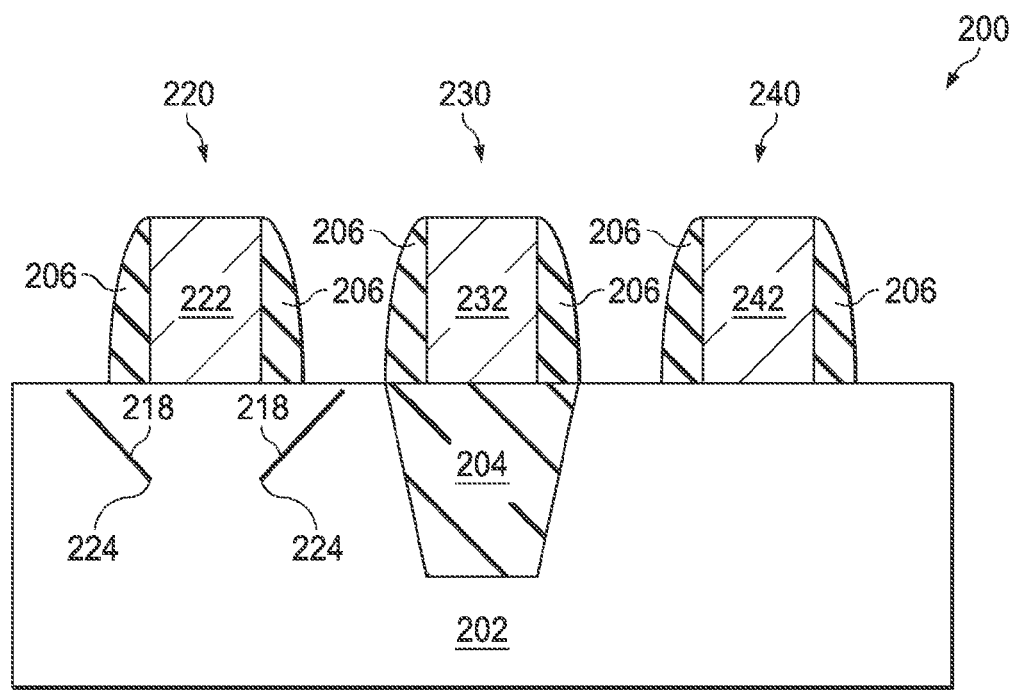

Referring to FIGS. 1 and 7, the method 100 proceeds to step 112 wherein the stress film 214 is removed from the substrate 202, the gate stacks 222, 232, and 242. The stress film 214 is removed, for example, by a wet etching using phosphoric acid or hydrofluoric acid, or by a dry etching using suitable etchant.

Figure 8:
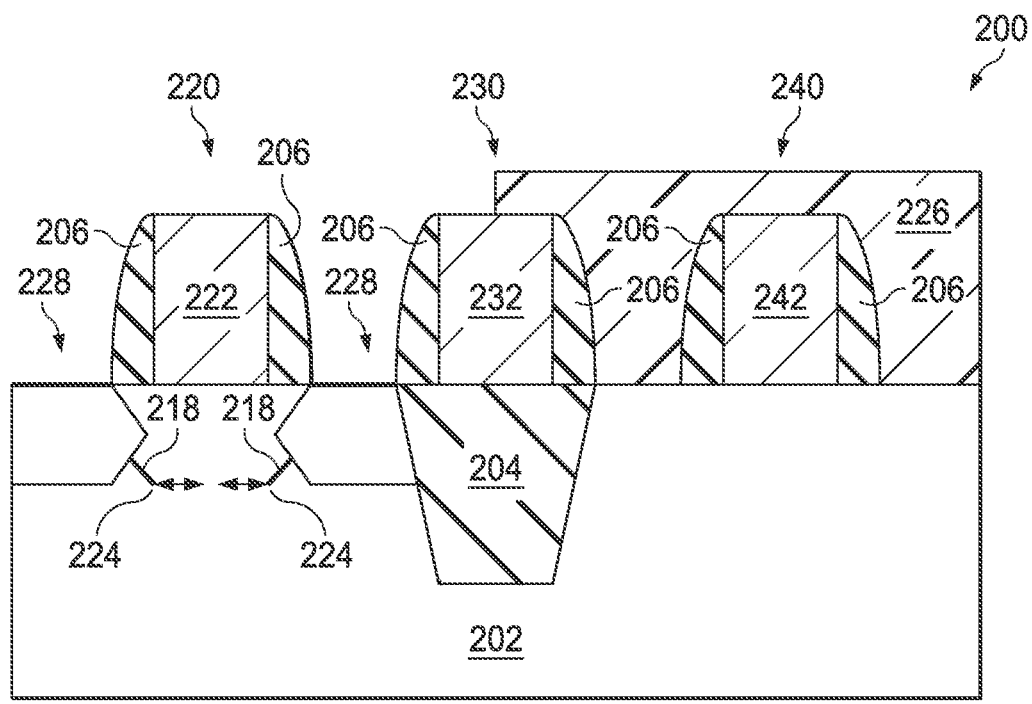

Referring to FIGS. 1 and 8, the method 100 proceeds to step 114 wherein recess cavities 228 are formed in the substrate 202. The recess cavities 228, for example, are adjacent to edges of the gate spacers 206 of the gate structure 220. In some embodiments, the recess cavities 228 are source and drain (S/D) recess cavities. In the present embodiment, the processes for forming the recess cavities 228 are started using an isotropic dry etching process, followed by an anisotropic wet or dry etching process. In some embodiments, the isotropic dry etching process is performed using the gate spacers 206 as hard masks to recess the surface 202s of the substrate 202. In some embodiments, the etching processes remove the upper portion of the dislocations 218 while leaving the lower portion of the dislocations 218 with pinchoff points 224.

In some embodiments, a patterned mask layer 226 is utilized to define where the recess cavities 228 are formed and protect other regions of the substrate 202 from being recessed. For example, the patterned mask layer 226 exposes the source/drain regions on both sides of the gate structure 220, such that the source/drain regions on both sides of the gate structure 220 are exposed to the etching processes (forming the recess cavities 228) while the source/drain regions on both sides of the gate structure 240 (and other portions of the semiconductor device 200) are protected from the etching processes. In other embodiments wherein an asymmetrical structure will be formed, only one side is exposed to the etching process to form a recess. In the present embodiment, the patterned mask layer 226 is a photoresist layer. Alternatively, the patterned mask layer 226 is a hard mask layer, such as a SiN or SiON layer. The patterned mask layer 226 is removed after forming the recess cavities 228.

Figure 9:
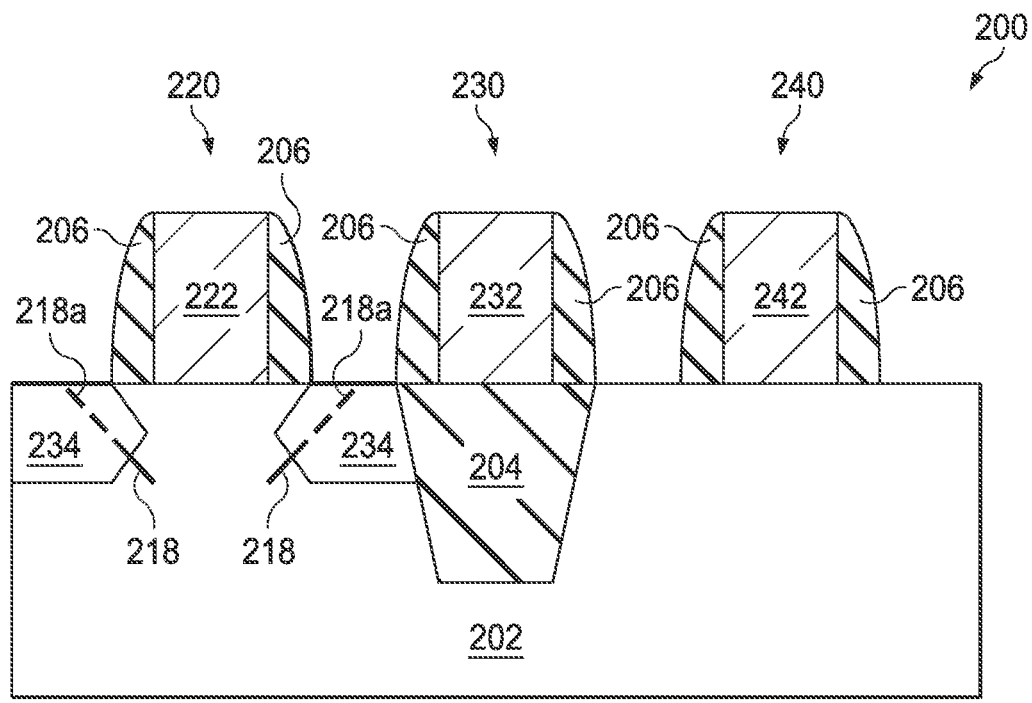

Referring to FIGS. 1 and 9, the method 100 proceeds to step 116 wherein source/drain (S/D) features 234 (also referred to as strained structures) are formed in the recess cavities 228 on both sides of the gate structure 220. The source/drain (S/D) features 234, for example, are strained materials grown in the recess cavities 228 using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epitaxial processes, or combinations thereof. In some embodiments, the strained materials include Si or SiC. In some embodiments, dislocations 218a are in the source/drain (S/D) features 234. In the present embodiment, the dislocations 218a are formed along a line defined by the lower portion of the dislocations 218. In the present embodiment, the dislocations 218a are located at the place substantially the same as the original place of the removed upper portion of the dislocation 218.

A benefit of utilizing annealing process with two periods of different constant temperatures for forming the dislocations, in accordance with the disclosed embodiments, is the enhancement of precisely controlling of locations of dislocations formed in the substrate. The method may therefore improve the uniformity of stress within the channel region. Moreover, after the formation of dislocations, in accordance with the disclosed embodiments, the method has the benefit of enhancing the uniformity of device performance. Thus, the disclosed embodiments provide increased stress in the channel region to improve carrier mobility with improved uniformity of devices. It is understood that different embodiments may have different advantages, and that no particular advantage is necessarily required of any embodiment.

The semiconductor device may undergo further CMOS or MOS technology processing to form various features known in the art. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer reacts with silicon to form a silicide, and then removing the non-reacted metal layer. An inter-level dielectric (ILD) layer can further be formed on the substrate and a chemical mechanical polishing (CMP) process can further be applied to the substrate to planarize the substrate. Further, a contact etch stop layer (CESL) may be formed on top of the gate structures before forming the ILD layer.

In an embodiment, the gate stacks comprise polysilicon in the final device. In another embodiment, a gate replacement process (or gate last process) is performed, where the polysilicon gate stacks are replaced with metal gates. The metal gates include liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

In one embodiment, a method of manufacturing a semiconductor device, comprises forming a gate stack over a substrate, performing a pre-amorphous implantation process on the substrate, forming a stress film over the substrate, thereafter performing an annealing process on the substrate, and removing the stress film. The annealing process comprises performing a first annealing step with a first temperature for a first period of time, and performing a second annealing step with a second temperature for a second period of time. The first temperature is different from the second temperature.

In another embodiment, a method of manufacturing a semiconductor device, comprises providing a substrate with an isolation feature therein, forming a first gate stack, a second gate stack, and a third gate stack over the substrate, forming spacers adjoining sidewalls of the first, the second, and the third gate stacks, forming amorphized regions adjacent to the first gate stack in the substrate, depositing a stress film over the first, the second, and the third gate stacks, and the amorphized regions, performing an annealing process such that the amorphized regions re-crystallize to form dislocations, and removing the stress film. The second gate stack is located between the first and the third gate stacks and atop the isolation feature. The annealing process comprises performing a first annealing step with a first temperature for a first period of time, and performing a second annealing step with a second temperature for a second period of time. The second temperature is greater than the first temperature.

In still another embodiment, a method of manufacturing a semiconductor device, comprises providing a substrate with an isolation feature therein, forming a first gate stack, a second gate stack, and a third gate stack over the substrate, forming spacers adjoining sidewalls of the first, the second, and the third gate stacks, forming amorphized regions adjacent to edges of the first gate stack in the substrate, depositing a stress film over the first, the second, and the third gate stacks, and the amorphized regions, performing an annealing process to re-crystallize the amorphized regions to form dislocations, thereafter removing the stress film, forming recesses adjacent to edges of the first gate stack in the substrate, and growing source/drain (S/D) features in the recesses. The second gate stack is located between the first and the third gate stacks and atop the isolation feature. The annealing process comprises performing a first annealing step with a first temperature for a first period of time, performing a second annealing step with a second temperature for a second period of time, and performing a third annealing step having a peak temperature. The peak temperature is greater than the second temperature and the second temperature is greater than the first temperature.

In an embodiment, a devices has a substrate having a first strain, a gate stack disposed over the substrate and source/drain (S/D) features in the substrate. The S/D features have a second strain different than the first strain. Dislocations are disposed substantially along lines extending from within the S/D features into the substrate and away from the S/D features to respective pinchoff points.

In another embodiment, a device has a substrate with an isolation feature therein. A first gate stack, a second gate stack, and a third gate stack are disposed over the substrate, and the second gate stack is located between the first and the third gate stacks and atop the isolation feature. A source and a drain are disposed in the substrate, and the source and drain each have a different strain than a strain of the substrate the substrate. The substrate comprises first dislocations disposed outside the source and drain and substantially along lines in the substrate that extend away from the source and drain to respective pinchoff points.

In another embodiment, a device has a substrate with an isolation feature therein and a first substrate region having a first strain. A first gate stack and a second gate stack are disposed over the substrate. The first gate stack is disposed over the first substrate region and the second gate stack is disposed over the isolation feature. Spacers adjoins sidewalls of the first and second gate stacks, and recesses are adjacent to edges of the first gate stack in the substrate. Source/drain (S/D) features are disposed in the recesses, and the S/D features have a second strain different than the first strain. Dislocations are disposed substantially along lines extending from within the S/D features into the first substrate region and away from the S/D features to respective pinchoff points disposed under the first gate stack.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate having a first strain;
   a gate stack disposed over the substrate;
   source/drain (S/D) features in the substrate, wherein the S/D features have a second strain different than the first strain; and
   dislocations disposed substantially along lines extending from within the S/D features into the substrate to respective pinchoff points outside of the S/D features.

2. The device of claim 1, further comprising:
   an isolation feature disposed in the substrate;
   wherein one of the S/D features extends laterally to the isolation feature.

3. The device of claim 1, further comprising:
   spacers adjoining sidewalls of the gate stack;
   wherein the lines extend under the spacers, and wherein a portion of the dislocations is aligned directly below the spacers.

4. The device of claim 1, wherein the lines extend under the gate stack, and wherein a portion of the dislocations is aligned directly below the gate stack.

5. The device of claim 1, wherein first dislocations extend from a source feature along a first line to a first pinchoff point; and
   wherein second dislocations extend from a drain feature along a second line to a second pinchoff point that is laterally spaced apart from the first pinchoff point.

6. The device of claim 1, wherein the lines extend in a <111> direction of a material of the substrate.

7. The device of claim 6, wherein the <111> direction of the material of the substrate is at an angle between about 45 and about 65 degrees, measured with respect to a top surface of the substrate.

8. A device comprising:
- a substrate with an isolation feature therein;
- a gate stack laterally spaced apart from the isolation feature; and
- a source and a drain disposed in the substrate, wherein the source and drain each have a different strain than a strain of the substrate, and wherein the gate stack is disposed between the source and the drain;
- wherein the substrate comprises first dislocations disposed outside the source and drain and substantially along lines in the substrate that extend to respective pinchoff points.

9. The device of claim 8, wherein one of the source and the drain extends laterally to the isolation feature.

10. The device of claim 8, further comprising:
- second dislocations disposed in the source and in the drain;
- wherein first portions of the lines extend into the source and the drain, and wherein the second dislocations are disposed along the first portions of the lines.

11. The device of claim 8, further comprising:
- spacers adjoining sidewalls of the gate stack;
- wherein the lines extend under the spacers, and wherein a portion of the first dislocations is aligned directly below the spacers.

12. The device of claim 8, wherein the lines extend under the gate stack, and wherein a portion of the first dislocations is aligned directly below the gate stack.

13. The device of claim 8, wherein a first portion of the first dislocations extends from the source to a first pinchoff point; and
- wherein a second portion of the first dislocations extends from the drain to a second pinchoff point that is laterally spaced apart from the first pinchoff point.

14. The device of claim 8, wherein the lines extend in a <111> direction of a material of the substrate;
- wherein the <111> direction of the material of the substrate is at an angle between about 45 and about 65 degrees, measured with respect to a top surface of the substrate.

15. A device comprising:
- a substrate with an isolation feature therein and a first substrate region having a first strain;
- a first gate stack and a second gate stack over the substrate, wherein the first gate stack is disposed over the first substrate region and wherein the second gate stack is disposed over the isolation feature;
- spacers adjoining sidewalls of the first and second gate stacks;
- recesses adjacent to edges of the first gate stack in the substrate; and
- source/drain (S/D) features in the recesses, wherein the S/D features have a second strain different than the first strain; and
- dislocations disposed substantially along lines extending from within the S/D features into the first substrate region to respective pinchoff points disposed under the first gate stack.

16. The device of claim 15, wherein one of the S/D features extends laterally to the isolation feature.

17. The device of claim 15, wherein the pinchoff points are laterally spaced apart from each other.

18. The device of claim 15, wherein the lines extend in a <111> direction of a material of the substrate.

19. The device of claim 18, wherein the <111> direction of the material of the substrate is at an angle between about 45 and about 65 degrees, measured with respect to a top surface of the substrate.

20. The device of claim 15, wherein a material of the S/D features comprises one of silicon carbide and silicon germanium.

* * * * *